United States Patent
Heenan

(10) Patent No.: US 6,614,121 B1
(45) Date of Patent: Sep. 2, 2003

(54) VERTICAL CACHE CONFIGURATION

(75) Inventor: Bryan Timothy Heenan, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 152 days.

(21) Appl. No.: 09/643,072

(22) Filed: Aug. 21, 2000

(51) Int. Cl.[7] .................. H01L 23/48; H01L 23/52; H01L 29/40
(52) U.S. Cl. .................. 257/777; 257/686; 257/698
(58) Field of Search .................. 257/698, 777, 257/686, 685, 774, 723, 724; 439/68, 69, 70, 81

(56) References Cited

U.S. PATENT DOCUMENTS

| | | | |
|---|---|---|---|
| 4,381,458 A | * | 4/1983 | Anstey et al. |
| 4,521,828 A | * | 6/1985 | Fanning |
| 5,266,912 A | * | 11/1993 | Kledzik |
| 5,285,107 A | * | 2/1994 | Kazami et al. |
| 5,376,825 A | * | 12/1994 | Tukomoto et al. |
| 5,481,436 A | * | 1/1996 | Werther |
| 5,557,504 A | * | 9/1996 | Siegel et al. |
| 5,777,852 A | * | 7/1998 | Bell |
| 5,953,214 A | * | 9/1999 | Dranchak et al. |
| 5,994,774 A | * | 11/1999 | Siegel et al. |
| 6,075,712 A | * | 6/2000 | McMahon |
| 6,390,827 B1 | * | 5/2002 | Howell et al. |

* cited by examiner

Primary Examiner—Sheila V. Clark
(74) Attorney, Agent, or Firm—Williams, Morgan & Amerson

(57) ABSTRACT

A semiconductor stack is provided. The semiconductor stack is comprised of a first semiconductor device, a second semiconductor device, and a socket. The first semiconductor device has a plurality of pins extending therefrom and arranged in a first preselected pattern. The socket is adapted to receive the plurality of pins. The second semiconductor device is disposed between the socket and the first semiconductor device and includes a die, a casing, and a plurality of electrical connections. The casing extends about the die and defines a plurality of openings extending therethrough. The openings are arranged in a first preselected pattern to receive the pins of the first semiconductor device. The plurality of electrical connections are disposed in at least a portion of the plurality of openings. The electrical connections are adapted to electrically communicate with the pins of the first semiconductor device inserted therein and the die.

8 Claims, 5 Drawing Sheets

VERTICAL CACHE CONFIGURATION

BACKGROUND OF THE INVENTION

1. Field of the Invention

This invention relates generally to semiconductor devices, and, more particularly, to a physical arrangement of a cache memory system.

2. Description of the Related Art

In modern computer systems, a significant factor in determining the overall performance of the computer system is the speed with which it accesses memory. Generally, faster memory accesses result in higher performance. Unfortunately, however, high-speed memory is expensive. Thus, it is generally economically unfeasible to construct a computer system that uses high-speed memory components as its main memory.

To provide a computer system with enhanced speed that is still economical to produce, many modern computer systems employ a memory system that consists of a hierarchy of several different levels. That is, the computer system has a relatively large and inexpensive main memory, which may be comprised of a relatively slow dynamic RAM, or the like, and at least one relatively small high-speed cache. The computer system attempts to maximize its speed of operation by utilizing the high-speed cache as much as possible, as opposed to the slow main memory. In fact, many computer systems have prefetch and cache management instructions that are highly successful when used with software that can predict the portions of main memory that are likely to be needed. The prefetches and cache management instructions can optimize moving data between the main memory and the caches. Thus, as long as the predictions are accurate, each request for memory should result in a hit in the cache, and faster overall operation.

Faster operaton of the cache may be achieved by locating the cache on the same die as the microprocessor. Such an arrangment minimizes the length of the electrical interconnections/lines extending between the cache and the microprocessor. Shorter line lengths translate into faster operation because signals take less time to travel therebetween.

There are, however, drawbacks to locating the cache on the same die as the microprocessor. For example, locating the cache on the die will substantially increase the number of transistors on the die. As the number of transistors increases, so does the error rate. That is, locating the cache on the die will increase the likelihood that the overall device will not operate properly, requiring the relatively expensive microprocessor to be scrapped along with the relatively inexpensive cache. Further, if the cache is located on the die, it is problematic to have different size caches on different microprocessor products. That is, it may be desirable to have several products that use the same microprocessor core with a different size or number of caches. Each of these products may have to undergo an expensive redesign and verification process before being released for production.

Locating the cache external to the microprocessor die has the advantage of flexibility in manufacturing. That is, the same microprocessor may be packaged with a variety of sizes and numbers of external caches without the need for separate designs. Moreover, a defect in the relatively inexpensive cache does not affect the usability of the expensive microprocessor die. As discussed above, however, the external cache ordinarily operates at a slower speed than a similar internal cache. Further, an external cache is ordinarily permanently soldered to a printed circuit board, such as a mother or daughter board. Thus, the external microprocessor takes up valuable printed circuit board real estate, and is difficult to update. That is, because the cache is soldered in place it cannot be easily upgraded by the end user when larger, faster, or less expensive caches become available.

The present invention is directed to overcoming, or at least reducing the effects of, one or more of the problems set forth above.

SUMMARY OF THE INVENTION

In one aspect of the present invention, a semiconductor module is provided. The semiconductor module is comprised of a die, a casing and a plurality of electrical connections. The casing extends about the die and defines a plurality of openings extending therethrough. The openings are arranged in a first preselected pattern to receive pins of a semiconductor device therein. A plurality of electrical connections are disposed in at least a portion of the plurality of openings and are adapted to electrically communicate with the pins of the semiconductor device inserted therein and the die.

In another aspect of the present invention, a semiconductor stack is provided. The semiconductor stack is comprised of a first semiconductor device, a second semiconductor device, and a socket. The first semiconductor device has a plurality of pins extending therefrom and arranged in a first preselected pattern. The socket is adapted to receive the plurality of pins. The second semiconductor device is disposed between the socket and the first semiconductor device and includes a die, a casing, and a plurality of electrical connections. The casing extends about the die and defines a plurality of openings extending therethrough. The openings are arranged in a first preselected pattern to receive the pins of the first semiconductor device. The plurality of electrical connections are disposed in at least a portion of the plurality of openings. The electrical connections are adapted to electrically communicate with the pins of the first semiconductor device inserted therein and the die.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
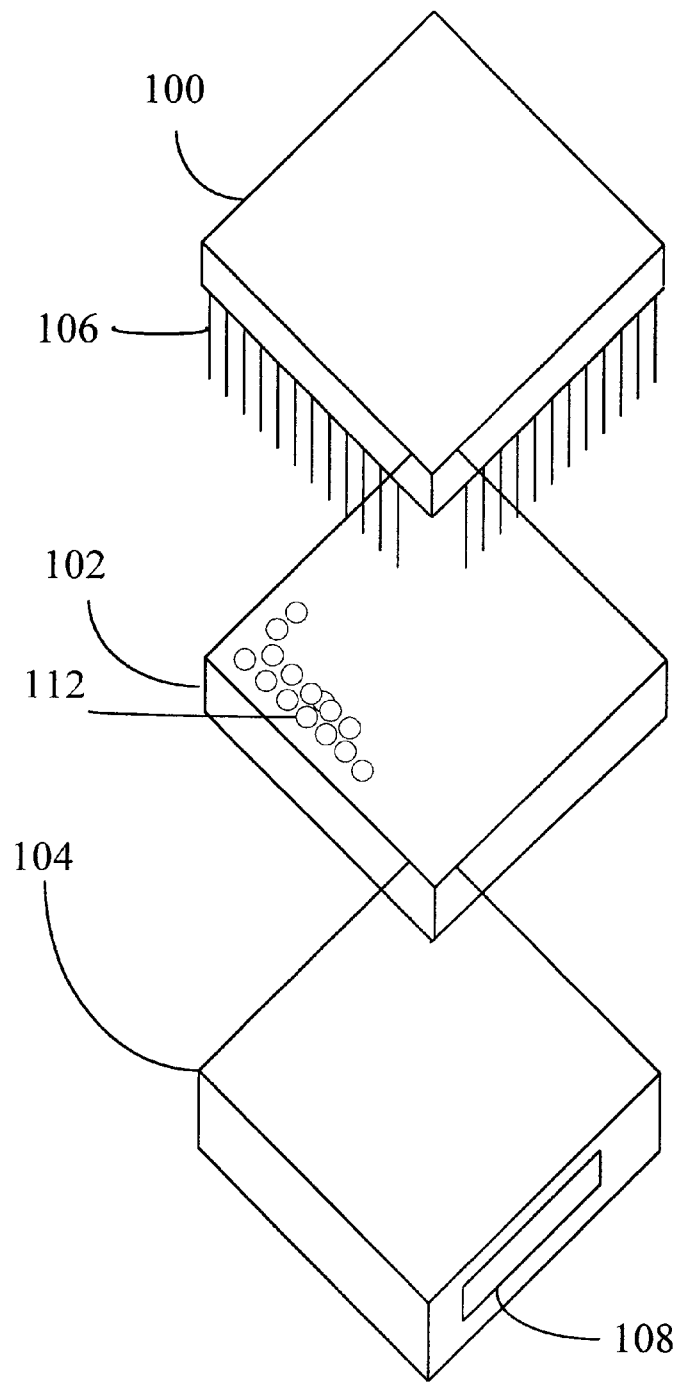
FIG. 1 illustrates an exploded perspective view of one embodiment of the instant invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–4. In general, the system shown in the drawings is directed to a physical arrangement of a microprocessor relative to a cache memory so as to provide a reliable and fast cache memory system. The instant invention, however, is not so limited, but has wider application than to a cache memory system. Rather, the instant invention may have application to a variety of semiconductor devices where it may be useful to separate the device into components on separate dies but still retain many of the advantages that arise from locating the components on a single die.

Referring now to the drawings, and beginning with FIG. 1, an exploded perspective view of a first and second semiconductor device, such as a conventional microprocessor 100 and a cache memory 102, are shown relative to a socket, such as a conventional zero insertion force (ZIF) type socket 104. The socket 104 is designed to removably receive a plurality of pins 106 extending from a lower surface of the microprocessor 100. The ZIF socket 104 has a lever 108 that may be manipulated between open and closed positions to respectively release and capture the pins 106. The ZIF socket 104 is conventional in configuration, and thus, is not described in greater detail herein to avoid unnecessarily obscuring the instant invention. The instant invention may be practiced with a variety of types of sockets and is not limited to use with the ZIF socket 104.

The ZIF socket 104 is mounted to a printed circuit board 110 by, for example, soldering pins (not shown) that extend from a bottom surface of the ZIF socket 104. Thus, the microprocessor 100 may be readily upgraded or replaced by operating the lever 108 to release the pins 106, allowing the microprocessor 100 to be removed and replaced.

Figure 2:
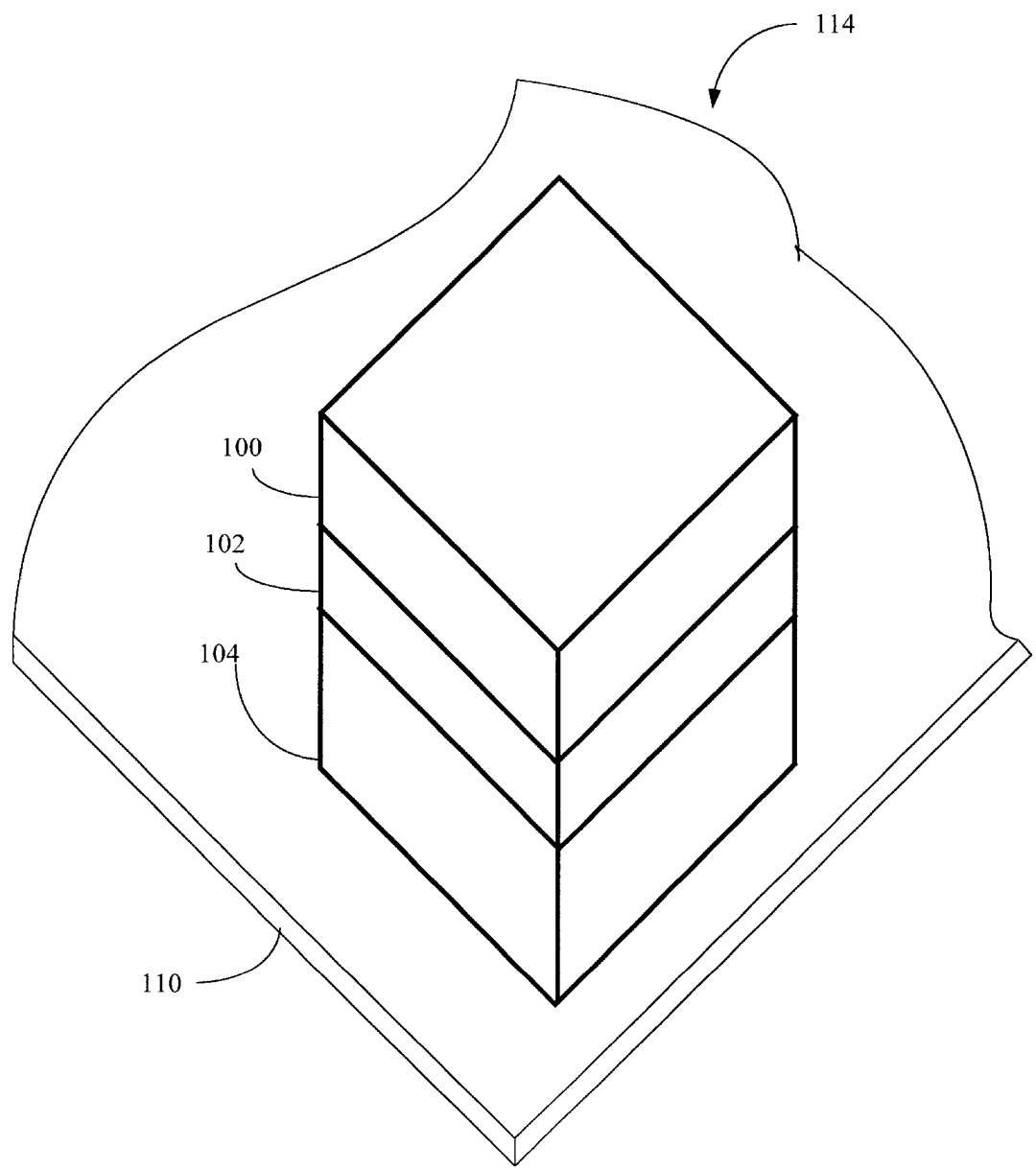
FIG. 2 illustrates an assembled perspective view of one embodiment of the instant invention.

The cache memory 102 is disposed intermediate the microprocessor 100 and ZIF socket 104. The cache memory 102 has a plurality of openings 112 arranged in a pattern that corresponds with the pins 106 on the microprocessor 100. The openings 112 receive the pins 106 therein, allowing the pins 106 to pass therethrough and into the ZIF socket 104 in one embodiment. As shown in FIG. 2, the microprocessor 100, cache memory 102, and ZIF socket 104 are assembled into a stack or sandwich configuration 114. The lever 108 of the ZIF socket 104 can be moved between open and closed positions to respectively release and grasp the pins 106, securing the microprocessor 100 and cache module 102 in a fixed position electrically interconnected with other devices (not shown) on the printed circuit board 110.

Figure 3:
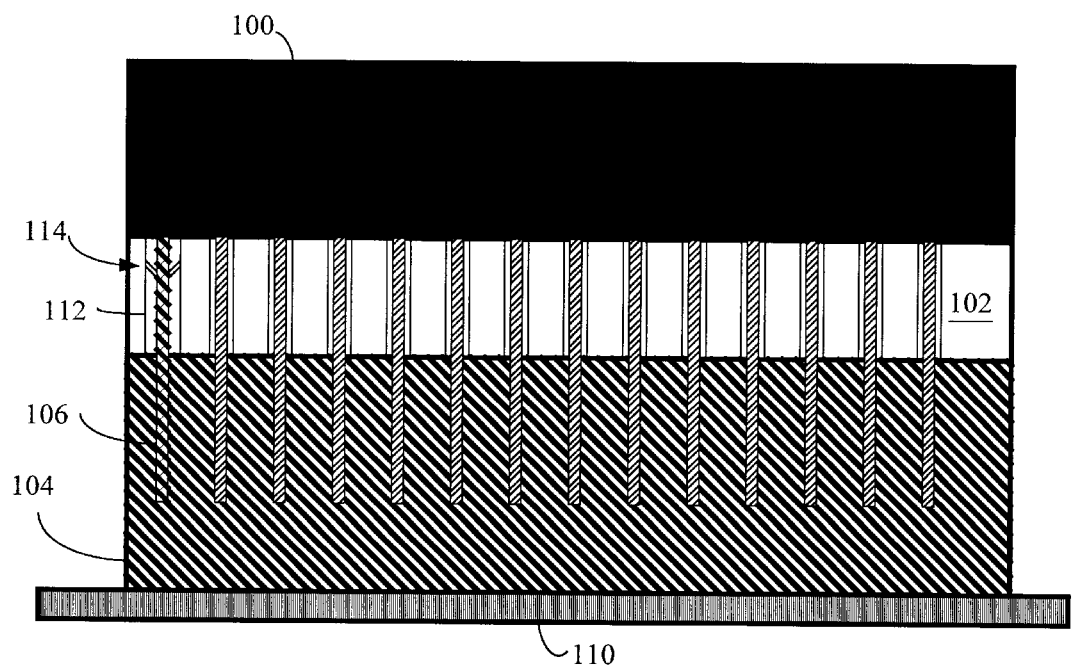
FIG. 3 illustrates a cross sectional side view of the embodiment of the instant invention illustrated in FIG. 2.

As shown in FIG. 3, the pins 106 extend through the openings 112 in the cache module 102 and into the ZIF socket 104. The action of the ZIF socket 104 to capture the pins 106 of the microprocessor 100 prevents removal of the microprocessor 100. The cache module 102 is likewise captured against removal by the same action of the ZIF socket 104 on the pins 106. That is, because of the sandwich arrangement, horizontal and vertical movement of the cache module 102 is restricted and/or substantially eliminated.

It should be appreciated that the cache module 102 should be electrically coupled to the microprocessor 100. Ordinarily, a cache and a microprocessor communicate with one another over a variety of communication paths, such as data and address lines. These data and address lines are communicated into and out of the microprocessor 100 on a portion of the pins 106. Since the pins 106 pass through the cache module 102, they are readily available to be coupled with the cache module 102. Accordingly at least a portion of the openings 112 have electrical connections 114 formed therein that physically mate with the pins 106 so that electrical signals can be transmitted between the cache module 102 and the pins 106 of the microprocessor 100. Additionally, the cache module 102 requires electrical power to operate properly. Since electrical power is delivered to the microprocessor 100 over preselected ones of the pins 106, the openings 112 that correspond to these "power" pins 106 may be equipped with electrical connections 114 to provide power to the cache module 102.

In an embodiment where a cache is separately mounted from the microprocessor 100 on the printed circuit board 110, the communication paths therebetween include metal traces formed into or on the printed circuit board 110, electrical connections (not shown) in the ZIF socket 104, the pins 106, bond wires, bond pads, and a metalization layer and contacts formed in the die using standard semiconductor processing techniques. In embodiments where the cache module 102 is formed on the same die as the microprocessor 100, the communication paths take the form of the metalization layer and contacts formed in the die. In the instant invention illustrated herein, the communication paths are comprised of the pins 106, bond wires, bond pads, and a metalization layer and contacts formed in the die of the microprocessor 100 and cache module 102. Thus, the length of the communication paths in the instant invention are substantially reduced over embodiments where the cache module 102 is separately mounted from the microprocessor 100 on the printed circuit board 102, as their communications paths need not include the metal traces formed into or on the printed circuit board 110 or the electrical connections (not shown) in the ZIF socket 104. This is particularly advantageous, in that the metal traces formed into or on the printed circuit board 110 tend to be the longest portion, by far, of the communication paths.

Figure 4:
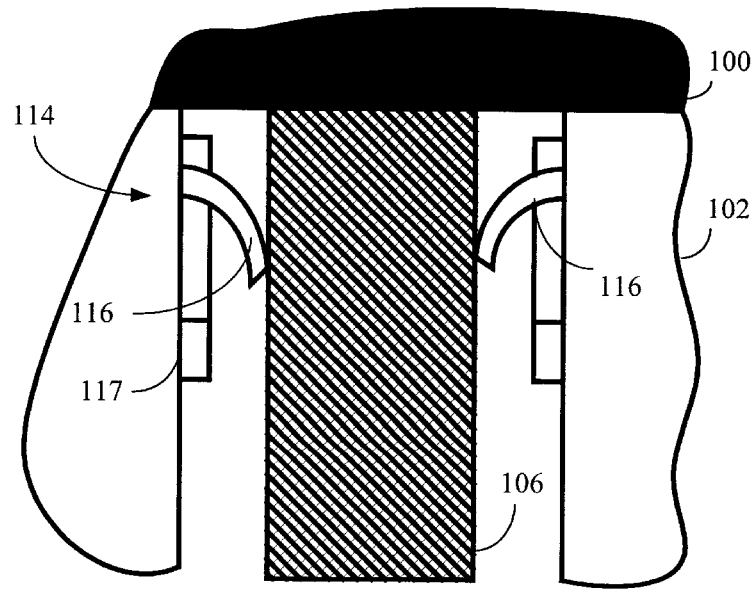
FIG. 4 illustrates an enlarged cross sectional side view of a portion of one embodiment the instant invention illustrated in FIG. 3.

The electrical connections 114 may take on any on any of a wide variety of forms, provided that relatively low resistance electrical contact is made between the pins 106 and the electrical connections 114. One embodiment of the electrical connections 114 is shown in FIG. 4. A pair of cantilevered spring members 116 are mounted in at least a portion of the openings 112 of the cache module 102. The cache module 102 has a casing 118 that houses a semiconductor die 120 (see FIG. 6). The casing 118 may be formed from a variety of materials commonly used to package semiconductor devices, such as epoxy, ceramic, and the like. Thus, one method of mounting the electrical connections 114 in at least a portion of the openings 112 involves molding the casing 118 about at least a portion of the electrical connections 114, leaving at least the cantilevered spring members 116 extending into the openings 112. The cantilevered spring members 116 are spaced sufficiently far apart and are sufficiently flexible so as to allow the pin 106 to pass therethrough while still allowing substantial physical engagement therebetween to ensure a low resistance electrical connection.

The cantilevered spring members 116 extend from a tubular body 117. The tubular body 117 may have external threads or other friction fittings formed thereon that engage an interior wall of the opening 112. Thus, the casing 118 may be formed with or without the openings 112 during the molding process. In the case where the openings 112 are not formed during molding, they may be subsequently formed by conventional drilling or punching operations. Once the openings 112 are formed, the tubular body 117 may be inserted therein by pressing, screwing, or the like. The frictional or threaded fittings may be sufficient to retain the tubular body 117 in the opening 112. If the frictional or threaded fittings are inadequate, or not provided, the tubular body 117 may be retained in the openings 112 by an adhesive, glue, epoxy, or the like.

In some embodiments of the cache module 102 it may be useful to locate electrical connections 114 in only those openings 112 that will mate with the pins 106 that carry electrical signals that need to be delivered to the semiconductor die 120. In alternative embodiments of the cache module 102 it may be useful to locate electrical connections 114 in more of the openings 112 than are needed to deliver the appropriate signals to the semiconductor die 120. That is, "dummy" electrical connections 114 may be located in some of the openings 112 without providing electrical contact to the semiconductor die 120. These dummy electrical connections 114 may serve to assist in securing the cache module 102 against horizontal motion relative to the ZIF socket 104 and microprocessor 100. This embodiment may prove useful in situations where all, or at least a majority of, the electrical connections 114 are located in a localized region of the cache module 102, which could allow limited, undesirable movement of the cache module 102. Additionally, for uniformity in manufacturing processes, and/or to restrict movement of the cache module 102, it may be useful to locate electrical connections 114 in all of the openings 112, and then only provide electrical contact to a preselected group thereof, as required by the semiconductor die 120.

Figure 5:
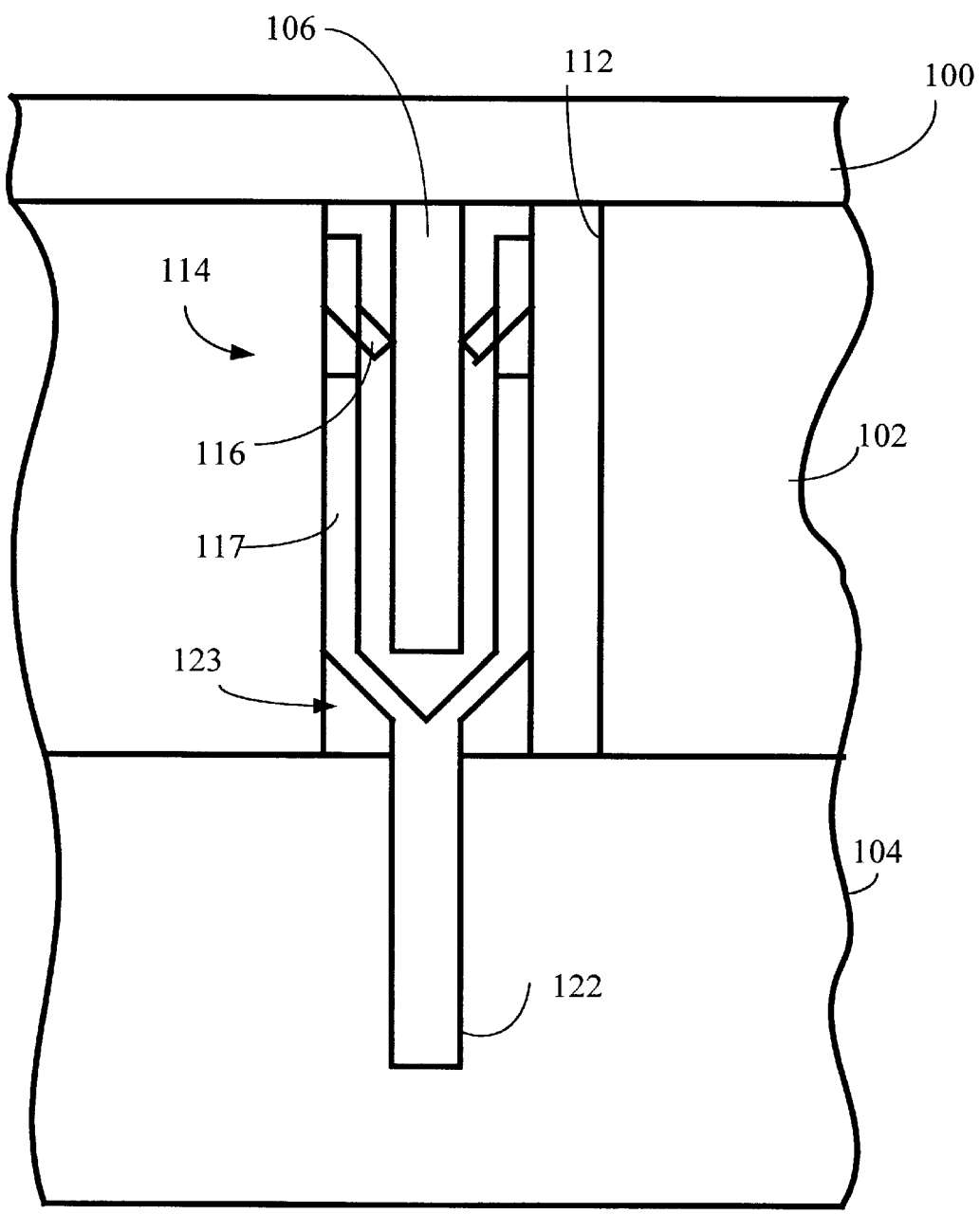
FIG. 5 illustrates an enlarged cross sectional side view of a portion of an alternative embodiment the instant invention illustrated in FIG. 3.

Turning now to FIG. 5, an alternative embodiment of the electrical connection 114 is illustrated. The embodiment illustrated in FIG. 5 may prove useful where the pins 106 are of insufficient length to pass through the cache module 102 and into the ZIF socket 104. In this embodiment, extensions 122 are mounted in each of the openings 112 and pass outward from the cache module 102 and into the ZIF socket 104. Thus, the ZIF socket 104 grasps the extensions 122 to retain the cache module 102 against undesired removal. The pins 106 of the microprocessor 100 extend into the tubular body 117 and engage the cantilevered spring members 116. The tubular body 117 includes a transition region 123 that changes the diameter of the electrical connection 114 from the relatively large diameter of the tubular body 117 to the relatively small diameter of the extensions 122. The diameter of the extensions 122 should be sufficiently small to enter the ZIF socket 104.

Figure 6:
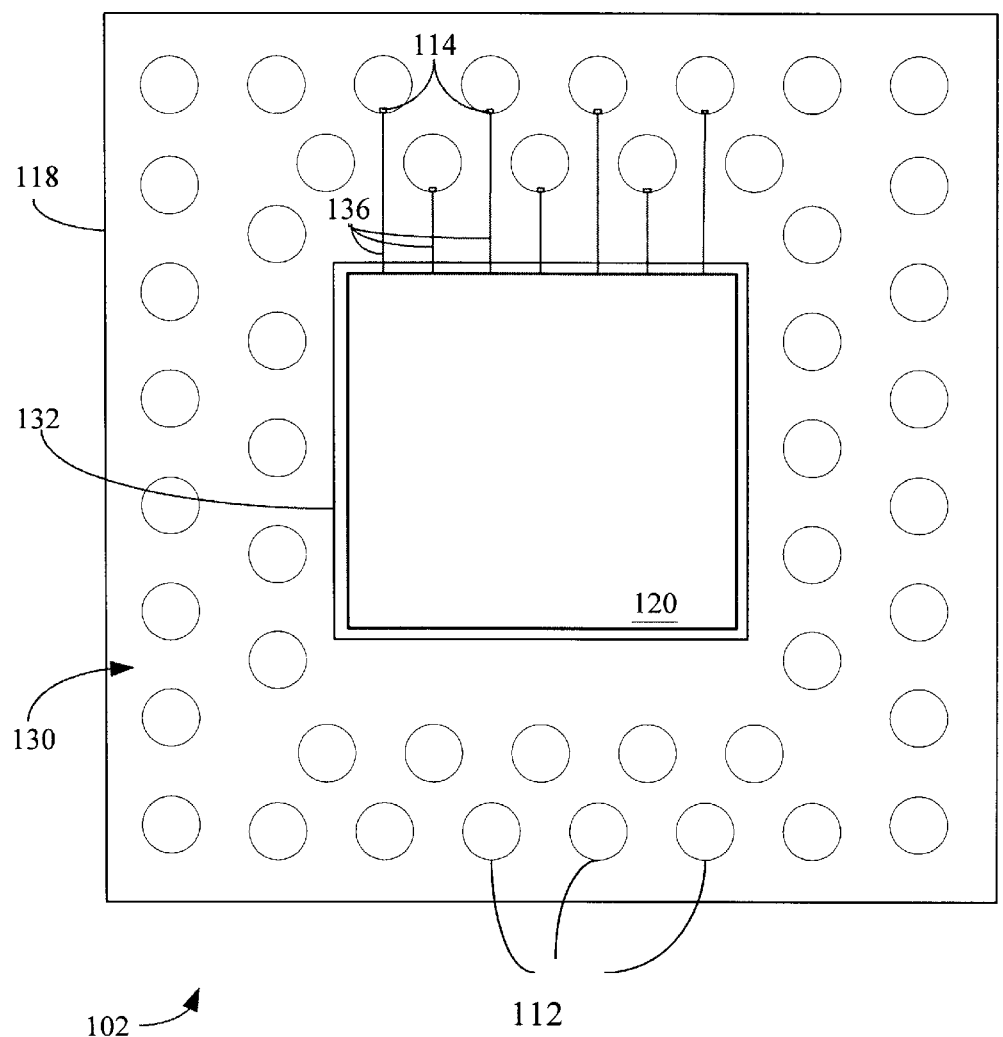
FIG. 6 illustrates a top, cross sectional view of one embodiment of a cache of FIGS. 1–3.

FIG. 6 illustrates a top cross sectional stylized view of the cache module 102. The openings 112 are positioned about a peripheral region 130 in the casing 118 of the cache module 102 in a pattern that matches the pattern of the pins 106. A central region 132 of the cache module 102 is free of the openings 112, and contains the semiconductor die 120. The semiconductor die 120 is electrically coupled to a portion of the electrical connections 114 positioned in the openings 112. The electrical couplings between the semiconductor die 120 and the electrical connections 114 may be provided by a variety of devices, including bond wire 136. In the interest of clarity, not all of the possible electrical couplings to all the possible electrical connections 114 have been shown in FIG. 6. However, it will be appreciated that, in alternative embodiments, as many as all of the openings 112, or as few as none of the openings 112, may contain electrical connections 114 that may be coupled to the semiconductor die 120.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor stack, comprising:

a first semiconductor device having a plurality of pins extending therefrom and arranged in a first preselected pattern;

a socket adapted to receive the plurality of pins; and a second semiconductor device disposed between the socket and the first semiconductor device, comprising:
 a die;
 a casing extending about the die and defining a plurality of openings extending therethrough, the openings being arranged in a first preselected pattern to receive the pins of the first semiconductor device and to allow the pins to pass through the casing and be received in the socket; and
 a plurality of electrical connections disposed in at least a portion of the plurality of openings, the electrical connections being adapted to electrically communicate with the pins of the first semiconductor device inserted therein and the die.

2. A semiconductor stack, as set forth in claim 1, wherein the first semiconductor device is further comprised of:

a die; and a casing extending about the first semiconductor die;

the plurality of pins extending from the casing and being electrically coupled with the first semiconductor die.

3. A semiconductor stack, as set forth in claim 2, wherein the first semiconductor die is a microprocessor.

4. A semiconductor stack, as set forth in claim 1, wherein the second semiconductor die is a cache.

5. A semiconductor stack, as set forth in claim 1, wherein the casing is formed from one of the group of ceramic and epoxy.

6. A semiconductor stack, as set forth in claim 1, wherein at least a portion of the plurality of electrical connections are electrically coupled to the second semiconductor die.

7. A semiconductor stack, as set forth in claim 1, wherein at least a portion of the plurality of electrical connections are electrically isolated from the second semiconductor die.

8. A semiconductor stack, as set forth in claim 1, wherein each of the electrical connections includes a first and second cantilevered spring member extending into the opening and adapted to engage one of the pins.

\* \* \* \* \*

UNITED STATES PATENT AND TRADEMARK OFFICE
CERTIFICATE OF CORRECTION

PATENT NO.   : 6,614,121 B1
DATED        : September 2, 2003
INVENTOR(S)  : Bryan Timothy Heenan It is certified that error appears in the above-identified patent and that said Letters Patent is hereby corrected as shown below:

Column 5,
Line 40, replace "arrangment" with -- arrangement --.

Signed and Sealed this

Twenty-first Day of October, 2003

JAMES E. ROGAN
*Director of the United States Patent and Trademark Office*